(12) United States Patent
Köppl et al.

(10) Patent No.: US 11,057,983 B2
(45) Date of Patent: Jul. 6, 2021

(54) PCB ASSEMBLY AND METHOD OF MANUFACTURING A PCB ASSEMBLY

(71) Applicant: Rohde & Schwarz GmbH & Co. KG, Munich (DE)

(72) Inventors: Josef Köppl, Zachenberg (DE); Andreas Geiss, Bischofsmais (DE); Manuel Spona, Lindberg (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 0 days.

(21) Appl. No.: 16/261,871

(22) Filed: Jan. 30, 2019

(65) Prior Publication Data
US 2020/0245446 A1  Jul. 30, 2020

(51) Int. Cl.
  *H05K 1/02* (2006.01)
  *F28D 15/02* (2006.01)
  *F28D 21/00* (2006.01)

(52) U.S. Cl.
  CPC ....... *H05K 1/0201* (2013.01); *F28D 15/0275* (2013.01); *F28D 2015/0225* (2013.01); *F28D 2021/0028* (2013.01); *H05K 2201/064* (2013.01); *H05K 2201/066* (2013.01)

(58) Field of Classification Search
  CPC .......... H05K 1/0201; H05K 2201/064; H05K 2201/066; H05K 1/02; F28D 15/0275; F28D 2015/0225; F28D 2021/0028
  USPC ....................................................... 174/252
  See application file for complete search history.

(56) References Cited

U.S. PATENT DOCUMENTS

| | | | |
|---|---|---|---|
| 5,000,252 A * | 3/1991 | Faghri | F28D 15/0275 165/10 |
| 2002/0121359 A1 | 9/2002 | Heikkila et al. | |
| 2008/0099909 A1* | 5/2008 | Baek | H01L 23/481 257/715 |
| 2013/0329368 A1* | 12/2013 | Degner | G06F 1/20 361/707 |
| 2015/0262907 A1* | 9/2015 | Degner | H05K 1/181 361/679.47 |
| 2016/0211794 A1* | 7/2016 | Kim | H01L 31/02008 |
| 2016/0349809 A1* | 12/2016 | Kinstle, III | H05K 7/20336 |
| 2017/0122673 A1* | 5/2017 | Chin | F28D 15/046 |
| 2018/0138387 A1* | 5/2018 | Wong | F28D 20/02 |
| 2019/0189532 A1* | 6/2019 | Huttunen | H05K 1/0209 |

FOREIGN PATENT DOCUMENTS

DE  10 2013 210 446 A1  12/2014
EP    3 318 831 A1   5/2018

* cited by examiner

*Primary Examiner* — Tremesha S Willis
(74) *Attorney, Agent, or Firm* — Westman, Champlin & Koehler, P.A.

(57) ABSTRACT

The present invention provides a PCB assembly. The PCB assembly comprises a PCB board element comprising an outer surface, and a micro heat pipe configured for heat transport. The micro heat pipe has a pipe wall and at least a section of the pipe wall is connected to the outer surface of the PCB board element in a thermally conductive manner. The thermally conductive connection may comprise a solder connection. Thus, a corresponding micro heat pipe may comprise a pipe wall, wherein at least a section of the pipe wall is configured to be soldered to a PCB element. Furthermore, the present invention provides a corresponding method of manufacturing a PCB assembly.

26 Claims, 6 Drawing Sheets

PCB ASSEMBLY AND METHOD OF MANUFACTURING A PCB ASSEMBLY

FIELD OF THE INVENTION

The present invention relates to a PCB assembly and to a method for manufacturing such a PCB assembly.

BACKGROUND OF THE INVENTION

Removing heat or in general heat transfer from a heat source is always an issue in printed circuit board (PCB) assemblies. Usually, heat is transferred to a heat sink by means of spring sheets, heat conducting paste, thermally conducting pads, or the like.

Furthermore, heat pipes are known as heat transfer devices combining the principles of both thermal conductivity and phase transition to transfer heat. Usually, such heat pipes are mechanically mounted on a PCB. However, heat pipes usually have macroscopic dimensions that delimit their field of application.

Therefore, so called micro heat pipes have been proposed, for example by EP 3 318 831 A1. However, such micro heat pipes are rather sensitive and hard to install in a mechanical way.

US 2002/0121359 describes another approach providing a plurality of embedded micro heat pipes which are formed embedded in a micro heat pipe module. The module comprises a coating on one side to dissipate the heat generated by a heat source arranged thereon along that side. Although such a module is comparably flat, it has rather macroscopic dimensions delimiting the field of application.

SUMMARY OF THE INVENTION

In view of the above, one of the ideas of the present invention is to provide a new and improved PCB assembly, a method for manufacturing such a PCB assembly and a corresponding micro heat pipe.

According to one aspect, therefore, the present invention provides a PCB assembly. The PCB assembly comprises a PCB board element comprising an outer surface and a micro heat pipe configured for heat transport. The micro heat pipe has a pipe wall and at least a section of the pipe wall is connected to the outer surface of the PCB board element in a thermally conductive manner.

According to another aspect, the invention provides a method of manufacturing a PCB assembly, comprising the steps of:

providing a PCB board element comprising an outer surface;

providing a micro heat pipe configured for heat transport, wherein the micro heat pipe has a pipe wall; and connecting at least a section of the pipe wall to the outer surface of the PCB board element in a thermally conductive manner.

According to a further aspect, the present invention provides a micro heat pipe configured for heat transport. The micro heat pipe has a pipe wall and at least a section of the pipe wall is configured to be soldered to a PCB element.

In this way, the invention provides a PCB assembly, method of manufacturing and micro heat pipe which is configured for improved and simplified thermal connection and heat transport. In particular, a direct connection to a device or heat source, such as a chip, amplifier or the like, and direct heat transfer on the PCB assembly is possible.

The heat pipe can be used for cooling or heating. It may thus be used to discharge heat from a heat source or to supply heat if desired, for example to quartz or the like.

Furthermore, the micro heat pipe may be used to distribute or spread heat directly on the PCB element.

A thermally conductive connection may be configured in horizontal or vertical arrangement of the micro heat pipe on the outer surface.

Advantageously, all this can be achieved in a process compatible processing and/or workmanship and at low cost. In particular, no special processing step is necessary to connect the micro heat pipe to the outer surface. For example, the micro heat pipe may be connected in a thermally conductive manner just by common hand- or reflow soldering. Furthermore, the connection can be realised on small areas and is therefore space-saving.

The invention further provides for the possibility of passages to the top side or bottom side of the assembly.

In an embodiment, the micro heat pipe may be configured as a current-carrying conductor. In this way, multiple functions can be integrated into the micro heat pipe.

According to an embodiment the micro heat pipe is configured as a longitudinal pipe having a diameter of less than or equal to 5 mm. According to another embodiment, the diameter may be less than or equal to 4 mm. According to yet another embodiment, the diameter may be less than or equal to 3 mm. Advantageously, such a micro heat pipe due to its small diameter can be directly surface connected on a PCB element in a thermally conductive manner, in particular soldered, for example reflow soldered, thereon.

According to an embodiment the thermally conductive connection of the pipe wall and the outer surface of the PCB board element comprises a solder connection. In this way, the PCB assembly can be easily manufactured.

According to an embodiment the pipe wall is connected to the outer surface along at least 50% of a longitudinal length of the micro heat pipe. According to another embodiment, the pipe wall is connected to the outer surface along at least 80% or along at least 90% of the longitudinal length. In this way, the micro heat pipe can be used as a heat spreader to distribute heat evenly over its length.

According to an embodiment the micro heat pipe comprises a first end and a second end, wherein the pipe wall is connected to the outer surface at one of the first or second end only. The other end is preferably situated in a different environment. For example, it may be connected to or formed as a heat sink. This way, effective heat transport is provided.

According to an embodiment the micro heat pipe comprises a first end and a second end, wherein the pipe wall is connected to the outer surface at both of the first and second ends. In this way, heat can be transported from one part of the PCB element, which in particular is configured as a heat source, to another part of the PCB element, which in particular has a different temperature level and/or is configured as a heat sink.

According to an embodiment the micro heat pipe comprises a solderable outer layer. In this way, the micro heat pipe is easily solderable to the outer surface of the PCB element. For example, the outer layer may comprise at least one of copper, gold, silver and nickel. Advantageously, these materials are compatible to solder and provide high thermal conductivity.

According to an embodiment the micro heat pipe is arranged on the PCB element along or in parallel to a conductor or to a ground line of the PCB element. In this way, heat can be evenly distributed along the conductor or ground line.

According to an embodiment the micro heat pipe is directly connected to a pad, Cu (copper)-coin or device on the PCB element. Accordingly, effective heat transport directly from or to the pad, coin or device is possible.

According to an embodiment the micro heat pipe comprises a first end and a second end, wherein the pipe wall is connected to the outer surface at the first end in such a way that the micro heat pipe protrudes at least substantially vertically from the surface. In this way, it can be easily led into another environment for heat exchange.

According to an embodiment the micro heat pipe comprises a first end and a second end, wherein the pipe wall is connected to the outer surface at the first end and coupled to a heat sink or cooling element at the second end. In particular, the heat sink or cooling element is an external heat sink or cooling element arranged at a distance from the PCB element. In this way, heat is effectively transported from the first end to the heat sink or cooling element and thus away from the PCB element.

According to an embodiment the pipe wall is configured to be soldered along at least 90% of a longitudinal length of the micro heat pipe. In this way, the micro heat pipe can be used as a heat spreader when it is soldered to a PCB element along its longitudinal length.

According to an embodiment the micro heat pipe comprises a first end and a second end, wherein the pipe wall is configured to be soldered at one of the first or second end only. In this way, one end can be easily thermally connected to a PCB element by soldering and the other end may be for example situated in a different environment or configured as or connected to a heat sink.

According to another embodiment, the pipe wall may be configured to be soldered at both of the first and second ends. In this way, the micro heat pipe can be connected to different parts of the PCB element and thus used to transfer heat from one part to the other part of the PCB element.

BRIEF DESCRIPTION OF THE DRAWINGS

For a more complete understanding of the invention and the advantages thereof, exemplary embodiments of the invention are explained in more detail in the following description with reference to the accompanying drawing figures, in which like reference characters designate like parts and in which.

The accompanying drawings are included to provide a further understanding of the present invention and are incorporated in and constitute a part of this specification. The drawings illustrate particular embodiments of the invention and together with the description serve to explain the principles of the invention. Other embodiments of the invention and many of the attendant advantages of the invention will be readily appreciated as they become better understood with reference to the following detailed description.

It will be appreciated that common and/or well understood elements that may be useful or necessary in a commercially feasible embodiment are not necessarily depicted in order to facilitate a more abstracted view of the embodiments. The elements of the drawings are not necessarily illustrated to scale relative to each other. It will further be appreciated that certain actions and/or steps in an embodiment of a method may be described or depicted in a particular order of occurrences while those skilled in the art will understand that such specificity with respect to sequence is not actually required. It will also be understood that the terms and expressions used in the present specification have the ordinary meaning as is accorded to such terms and expressions with respect to their corresponding respective areas of inquiry and study, except where specific meanings have otherwise been set forth herein.

DETAILED DESCRIPTION OF EMBODIMENTS

Figure 1:
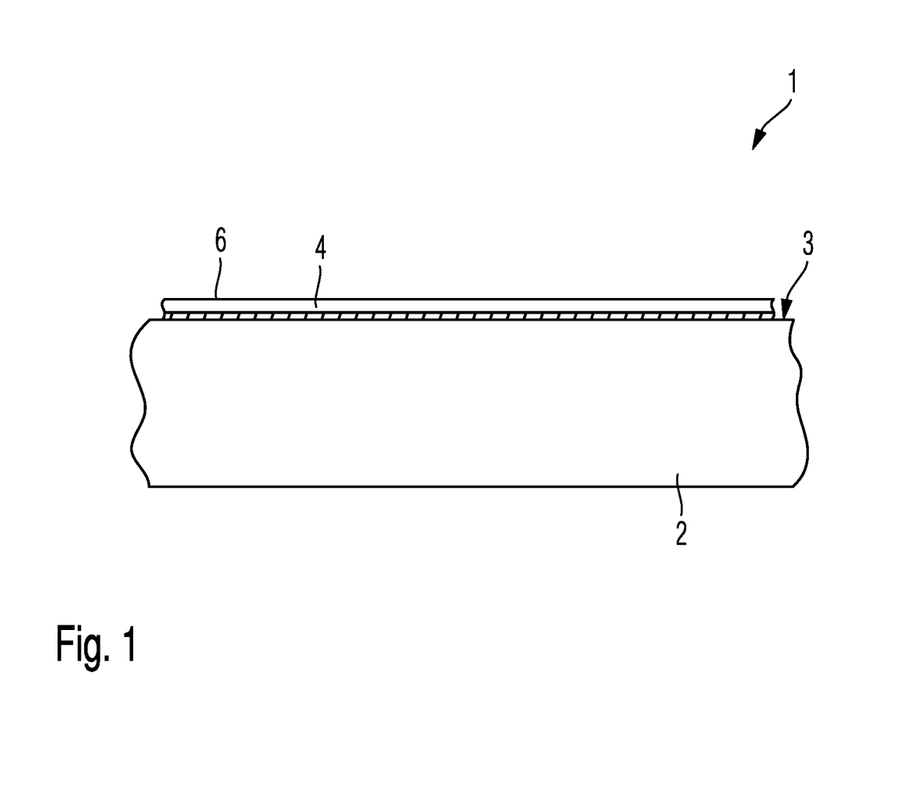
FIG. 1 is a schematic side view of a PCB assembly.

With reference firstly to FIG. 1 of the drawings, a PCB assembly 1 is illustrated schematically. The PCB assembly 1 includes a PCB board element 2 comprising an outer surface 3.

A PCB element 2 may be configured as any kind of printed circuit board configured to mechanically support and electrically connect electronic components or electrical components using conductive tracks, pads or other features. For example, tracks, pads or other features may be etched from one or more sheet layers of copper laminated onto and/or between sheet layers of a non-conductive substrate.

The PCB assembly 1 further includes a micro heat pipe 4 configured for heat transport. The micro heat pipe 4 has a pipe wall 6 and at least a section 5 of the pipe wall 6 is connected to the outer surface 3 of the PCB board element in a thermally conductive manner, for example by means of soldering.

Figure 2:
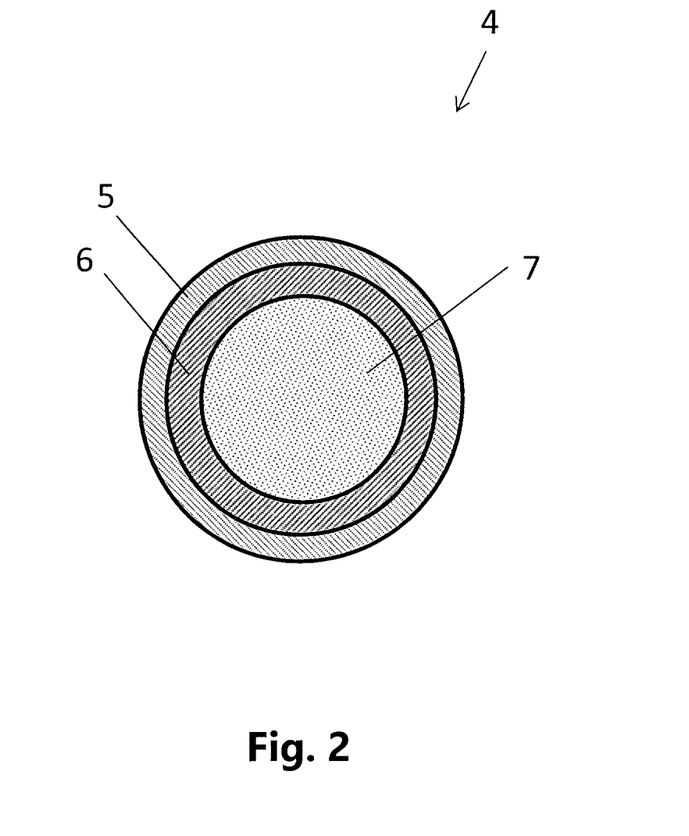
FIG. 2 is a schematic sectional view of a micro heat pipe.

Referring to FIG. 2 of the drawings, a micro heat pipe 4 is illustrated schematically in a sectional view.

A heat pipe is a device that utilizes evaporation heat transfer and condensation heat transfer. It includes a pipe wall 6 and a working medium inside a capillary structure 7. If the medium is vaporized in a hotter part of the heat pipe, a vapour flow begins from the hotter part to a colder part due to a vapour pressure difference. As a consequence, liquid medium flows from the colder part to the hotter part, usually by capillary force. Depending on the type and orientation of the micro heat pipe, also gravitational, electrostatic or other forces may act on the medium. In this way, considerable amounts of heat can be transported at relatively low temperature differences.

A micro heat pipe 4 as illustrated in FIG. 2 is a small, in particular thin type of heat pipe. It usually uses a microchannel structure as capillary structure 7. Preferably, the micro heat pipe 4 is configured as a longitudinal pipe having a diameter of less than or equal to 5 mm, preferably less than or equal to 4 mm, most preferably less than or equal to 3 mm.

According to an embodiment, the micro heat pipe 4 may be configured with a straight shape along a longitudinal axis. According to another embodiment, the heat pipe 4 may be configured with a bended shape or may include a mixture of straight and bended shapes.

In the exemplary embodiment of FIG. 2, the micro heat pipe 4, in particular the pipe wall 6 thereof, has a circular cross section.

According to another embodiment, the heat pipe may be configured as a flattened pipe structure, for example processed from a circular shape which is flattened. According to another embodiment, the micro heat pipe 4 may be of an ultra-thin flattened type which advantageously may limit the thickness of the PCB assembly 1.

As will be appreciated, the shape of the cross section of the micro heat pipe may also change along its longitudinal length, for example from a circular to a flattened shape or vice versa.

At least a section 5 of the pipe wall 6 may be configured to be soldered to a PCB board element 2.

Figure 3:
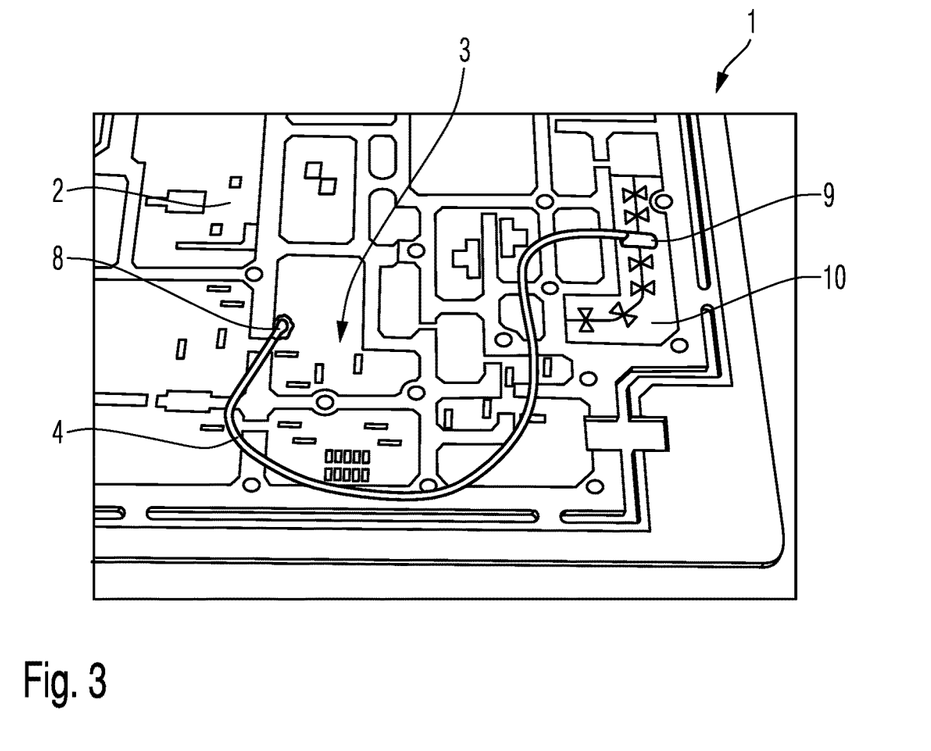
FIG. 3 is a perspective view of a micro heat pipe connected to a PCB board according to a second embodiment.

FIG. 3 shows a PCB assembly 1 including a PCB element 2 configured as a printed circuit board and a micro heat pipe 4 connected by to the outer surface 3 of the PCB element 2 at solderable sections 5 of the pipe wall 6 on a first end 8 and a second end 9. Preferably, the first end 8 may be connected to a heat generating element or area of the PCB element, at which heat is received by the micro heat pipe 4 and transported to the second end 9 that may be connected to a heat absorbing element 10 such as a heat sink. The heat sink 10 may be a metal element, such as an area or block of metal, as for example a Cu-coin. In this way, heat is effectively transported between the elements connected to the first end 8 and second end 9 of the PCB element, which in particular have a different temperature level.

For example, the thermally conductive connection of the pipe wall 6 and the outer surface 3 of the PCB element 2 may comprise a solder connection. In such way, the PCB assembly 1 can be easily manufactured. Preferably, the micro heat pipe 4 comprises a solderable outer layer 5. In this way, the micro heat pipe 4 is easily solderable to the outer surface 3, which includes elements arranged on the outer surface 3, of the PCB element 2. For example, the solderable outer layer 5 may comprise at least one of copper, gold, silver and nickel. Advantageously, these materials are compatible to solder and provide high terminal conductivity.

Further, the micro heat pipe 4 may be configured as a current-carrying conductor. This allows the integration of multiple functions into the micro heat pipe 4.

Figure 4:
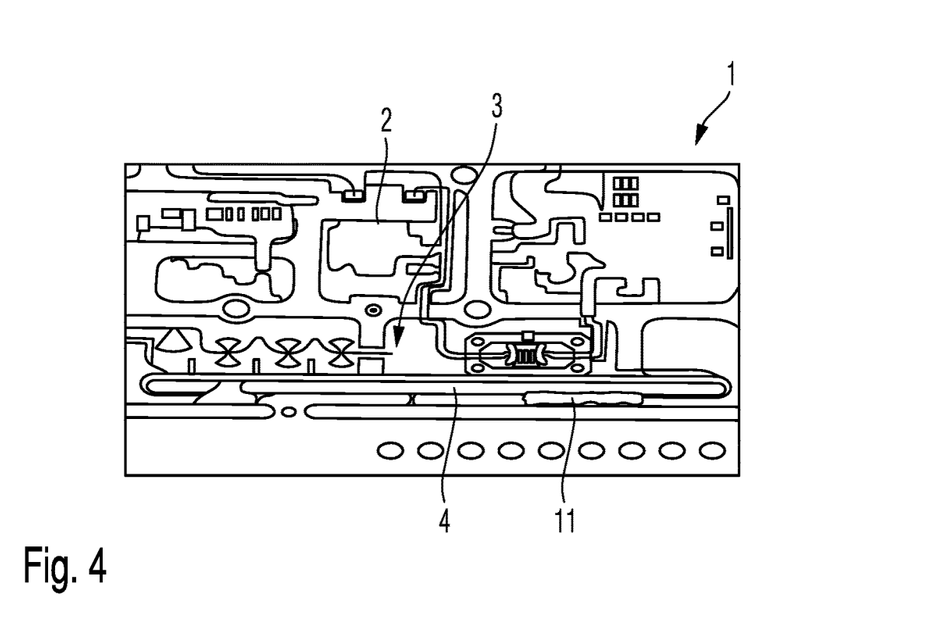
FIG. 4 is a perspective view of a bended micro heat pipe connected to a PCB board according to a third embodiment.

With reference to the PCB assembly 1 illustrated in FIG. 4, the outer wall 5 of the micro heat pipe 4 is connected to the outer surface 3 of the PCB element 2 along more than 50% of a longitudinal length of the micro heat pipe 4. The micro heat pipe 4 is arranged on the PCB board element 2 along or in parallel to a conductor line 11 of the PCB element 2. In this way, the micro heat pipe 4 can be used as a heat spreader to distribute heat evenly along the conductor line 11.

Figure 5:
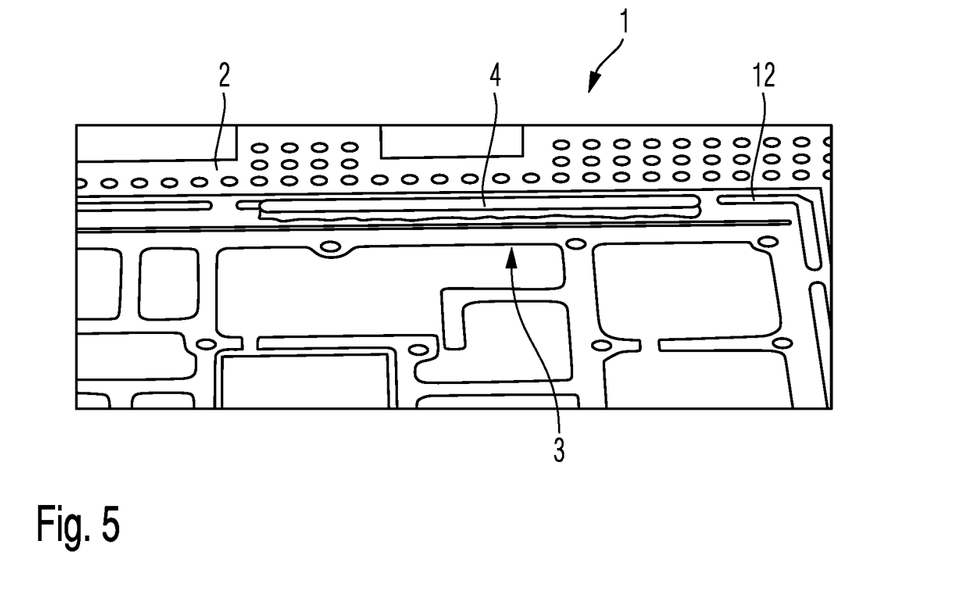
FIG. 5 is a perspective view of a micro heat pipe connected to a PCB board according to a fourth embodiment.

According to the PCB assembly 1 shown in FIG. 5, the micro heat pipe 4 is connected on the outer surface 3 of the PCB element 2 such that the outer layer 5 of the pipe wall 6 is connected along more than 90% of the longitudinal length of the micro heat pipe 4. It may be, for example, arranged on the surface 3 of the PCB element 2 along or in parallel to a ground line 12 of the PCB element.

The ground line 12 of a PCB element is a contact line, for example located circumferentially on the PCB element 2, which is forming or electrically connected to a ground potential.

Figure 6:
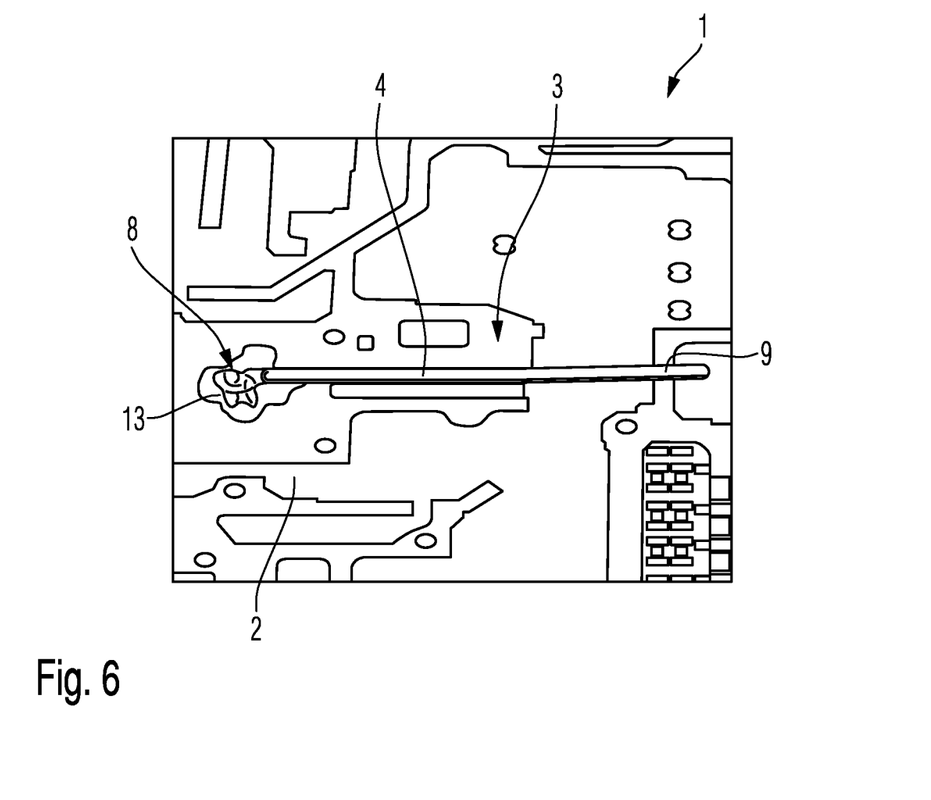
FIG. 6 is a perspective view of a micro heat pipe connected to a PCB board according to a fifth embodiment.

Referring now to FIG. 6, the micro heat pipe 4 may also be connected to the upper surface 3 of the PCB board 2 on its first end 8 over a solder pad 13. Accordingly, effective heat transport from a device or the like connected to the solder pad 13 is possible.

The second end 9 may be configured as a blind end, as shown in FIG. 6, or connected to a heat sink, cooling element or the like.

In other embodiments, the solder pad 13 is connected to a first heat sink 10 at the first end 8 of the heat pipe, while the second end 9 is connected to a second heat sink with higher heat capacity or to a cooling element or the like, effectively cooling the first heat sink 10. In some embodiments, the solder pad 13 may act as or contribute to the heat sink 10 by increasing its heat capacity.

Figure 7:
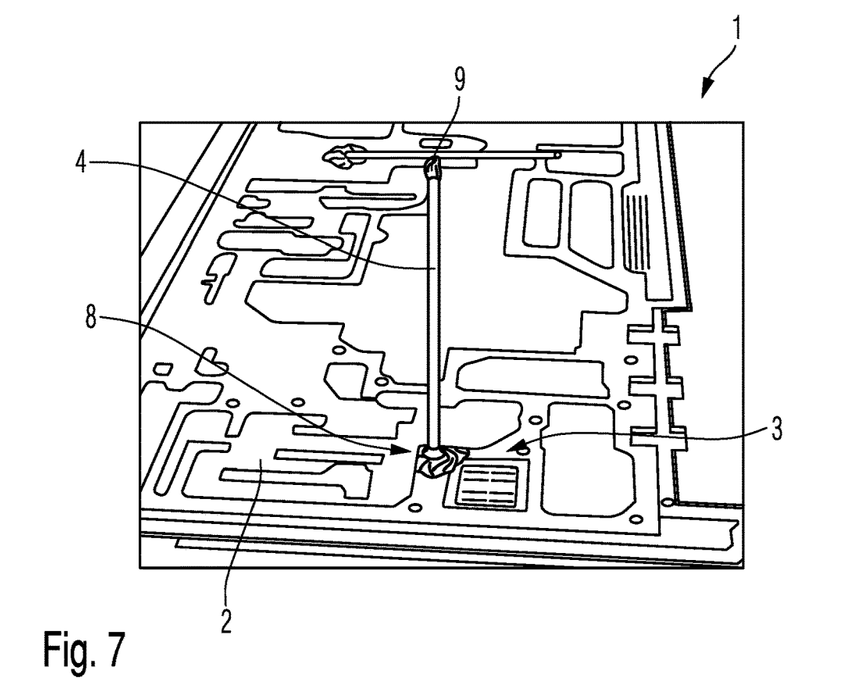
FIG. 7 is a perspective view of a micro heat pipe connected to a PCB board according to a sixth embodiment.

In another embodiment of the PCB assembly 1 as shown in FIG. 7, the pipe wall 5 of the micro heat pipe 4 may be connected to the outer surface 3 at the first end in such a way that the micro heat pipe 4 protrudes substantially vertically from the surface. This may be advantageously employed to lead generated heat into another environment for better heat exchange. As an example, the second end 9 may protrude in the air for cooling without any further element connected to its second end.

Figure 8:
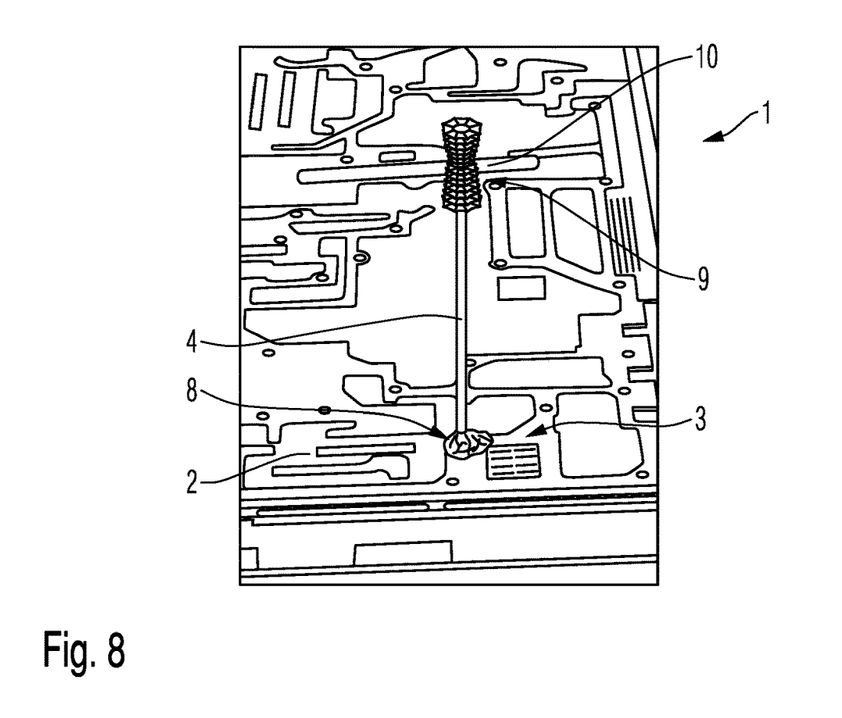
FIG. 8 is a perspective view of a micro heat pipe connected to a PCB board according to a seventh embodiment.

In another embodiment as shown in FIG. 8, the pipe wall 5 may be connected to the outer surface 3 of the PCB board 2 at the first end 8 such that the micro heat pipe 4 is oriented vertically to the PCB element 2 and protrudes therefrom and the second end 9 coupled to a heat sink 10, which may be in particular arranged in another environment. In such a way, heat generated on the PCB board 2 can dissipate effectively over the micro heat pipe 4 to the heat sink 10. Alternatively, or in addition, an active cooling element or the like may be provided at the second end 9.

Figure 9:
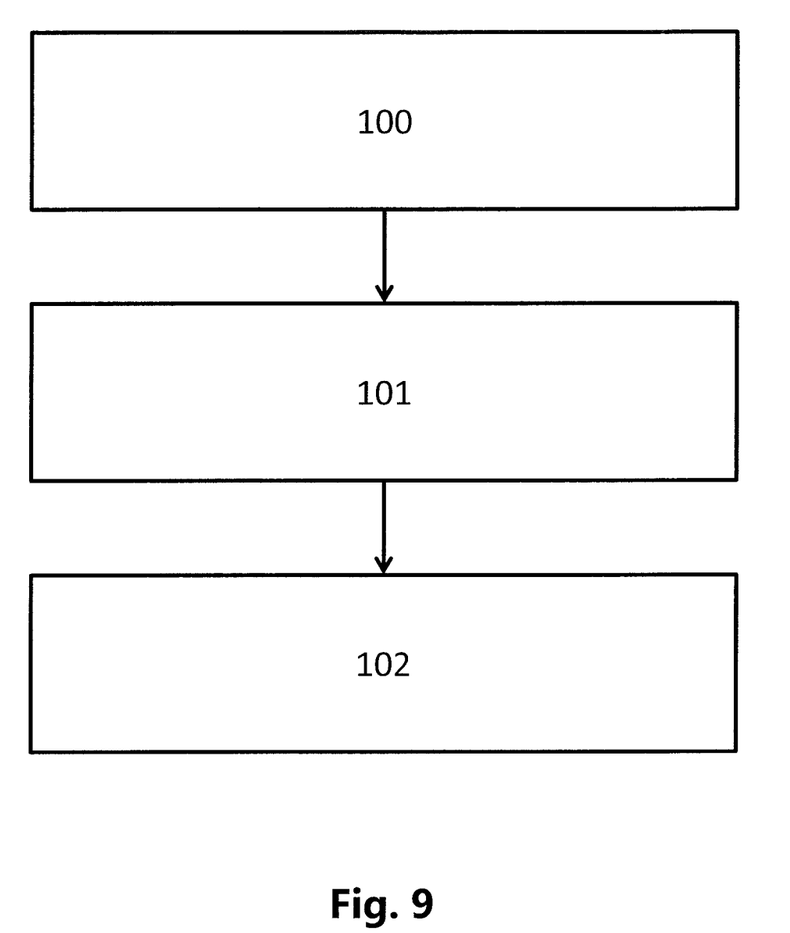
FIG. 9 is a flow diagram which schematically illustrates a method according to an embodiment of the invention.

With reference now also to FIG. 9 of the drawings, a flow diagram is shown that illustrates schematically the steps in a method of manufacturing a PCB assembly.

The method comprises a first step 100 of providing a PCB board element 2 comprising an outer surface 3. A second step 101 comprised in the method is providing a micro heat pipe 4 configured for heat transport, wherein the micro heat pipe 4 has a pipe wall 5. A third step 102 comprised in the method is connecting at least a section of the pipe wall 5 to the outer surface 3 of the PCB board element 2 in a thermally conductive manner.

Although specific embodiments of the invention are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms "comprise", "comprising", "include", "including", "contain", "containing", "have", "having", and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms "a" and "an" used herein are intended to be understood as meaning one or more unless explicitly stated otherwise. Moreover, the terms "first", "second", "third", etc. are used merely as labels, and are not intended to impose numerical requirements on or to establish a certain ranking of importance of their objects.

The invention claimed is:

1. A Printed Circuit Board (PCB) assembly, comprising:
a PCB board element comprising an outer surface,
a micro heat pipe configured for heat transport, wherein the micro heat pipe has a pipe wall,
wherein at least a section of the pipe wall is connected to the outer surface of the PCB board element in a thermally conductive manner, and
wherein the pipe wall is connected to the outer surface along at least 50% of a longitudinal length of the micro heat pipe,
wherein the micro heat pipe is configured as a longitudinal pipe having a maximum diameter of less than or equal to 4 mm.

2. The assembly of claim 1, wherein the thermally conductive connection of the pipe wall and the outer surface of the PCB board element comprises a solder connection.

3. The assembly of claim 1, wherein the pipe wall is connected to the outer surface along at least 90% of a longitudinal length of the micro heat pipe.

4. The assembly of claim 1, wherein the micro heat pipe comprises a first end and a second end, wherein the pipe wall is connected to the outer surface at both of the first and second ends.

5. The assembly of claim 1, wherein the micro heat pipe comprises a solderable outer layer.

6. The assembly of claim 5, wherein the solderable outer layer comprises at least one of copper, gold, silver and nickel.

7. The assembly of claim 1, wherein the micro heat pipe is arranged on the PCB element along or in parallel to a conductor or to a ground line of the PCB element.

8. The assembly of claim 1, wherein the micro heat pipe is directly connected to a pad, CU-coin or device on the PCB element.

9. The assembly of claim 1, wherein the micro heat pipe comprises a first end and a second end, wherein the pipe wall is connected to the outer surface at the first end and coupled to a heat sink or cooling element at the second end.

10. A method of manufacturing a PCB assembly, comprising the steps of:
providing a PCB board element comprising an outer surface;
providing a micro heat pipe configured for heat transport, wherein the micro heat pipe has a pipe wall; and
connecting at least a section of the pipe wall to the outer surface of the PCB board element in a thermally conductive manner, and
wherein the pipe wall is connected to the outer surface along at least 50% of a longitudinal length of the micro heat pipe,
wherein the micro heat pipe is configured as a longitudinal pipe having a maximum diameter of less than or equal to 4 mm.

11. The method of claim 10, wherein thermally conductive connecting the pipe wall and the outer surface of the PCB board element comprises soldering the pipe wall to the outer surface.

12. The method of claim 10, wherein the pipe wall is connected to the outer surface along at least 90% of a longitudinal length of the micro heat pipe.

13. The method of claim 10, wherein the micro heat pipe comprises a first end and a second end, and wherein the pipe wall is connected to the outer surface at one of the first or second end only or is connected to the outer surface at both of the first and second ends.

14. A micro heat pipe configured for heat transport,
wherein the micro heat pipe has a pipe wall, and
wherein at least a section of the pipe wall is configured to be soldered to a PCB element,
wherein the micro heat pipe comprises a first end and a second end, and
wherein the pipe wall is configured to be soldered to an outer surface of the PCB element at both of the first and second ends, so that heat can be transported from one part of the PCB element, which is configured as a heat source, to another part of the PCB element, which has a different temperature level or is configured as a heat sink.

15. The micro heat pipe of claim 14, wherein the pipe wall is configured to be soldered along at least 90% of a longitudinal length of the micro heat pipe.

16. A PCB assembly, comprising:
a PCB board element comprising an outer surface,
a micro heat pipe configured for heat transport, wherein the micro heat pipe has a pipe wall,
wherein at least a section of the pipe wall is connected to the outer surface of the PCB board element in a thermally conductive manner,
wherein the micro heat pipe comprises a first end and a second end, and
wherein the pipe wall is connected to the outer surface at both of the first and second ends, so that heat can be transported from one part of the PCB element, which is configured as a heat source, to another part of the PCB element, which has a different temperature level or is configured as a heat sink,
wherein the thermally conductive connection of the pipe wall and the outer surface of the PCB board element comprises a solder connection.

17. The assembly of claim 16, wherein the micro heat pipe is configured as a longitudinal pipe having a maximum diameter of less than or equal to 4 mm.

18. The assembly of claim 16, wherein the pipe wall is connected to the outer surface along at least 50% of a longitudinal length of the micro heat pipe.

19. The assembly of claim 16, wherein the pipe wall is connected to the outer surface along at least 90% of a longitudinal length of the micro heat pipe.

20. The assembly of claim 16, wherein the micro heat pipe is arranged on the PCB element along or in parallel to a conductor or to a ground line of the PCB element.

21. The assembly of claim 16, wherein the micro heat pipe is directly connected to a pad, CU-coin or device on the PCB element.

22. The assembly of claim 16, wherein the pipe wall is connected to the outer surface at the first end in such a way that the micro heat pipe protrudes at least substantially vertically from the surface.

23. The assembly of claim 16, wherein the pipe wall is connected to the outer surface at the first end and coupled to a heat sink or cooling element at the second end.

24. A method of manufacturing a PCB assembly, comprising the steps of:

providing a PCB board element comprising an outer surface;

providing a micro heat pipe configured for heat transport, wherein the micro heat pipe has a pipe wall; and connecting at least a section of the pipe wall to the outer surface of the PCB board element in a thermally conductive manner, wherein the micro heat pipe comprises a first end and a second end, and wherein the pipe wall is connected to the outer surface at both of the first and second ends, so that heat can be transported from one part of the PCB element, which is configured as a heat source, to another part of the PCB element, which has a different temperature level or is configured as a heat sink, wherein the thermally conductive connection of the pipe wall and the outer surface of the PCB board element comprises a solder connection.

25. The method of claim 24, wherein thermally conductive connecting the pipe wall and the outer surface of the PCB board element comprises soldering the pipe wall to the outer surface.

26. The method of claim 24, wherein the pipe wall is connected to the outer surface along at least 90% of a longitudinal length of the micro heat pipe.

* * * * *